(12) United States Patent
Hagl

(10) Patent No.: US 6,418,396 B2
(45) Date of Patent: *Jul. 9, 2002

(54) METHOD FOR OPERATING A POSITION MEASURING SYSTEM AND POSITION MEASURING SYSTEM FOR THE PURPOSE

(75) Inventor: Rainer Hagl, Altenmarkt (DE)

(73) Assignee: Johannes Heidenhain GmbH, Traunreut (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/247,625

(22) Filed: Feb. 10, 1999

(30) Foreign Application Priority Data

Feb. 21, 1998 (DE) .......................... 198 07 377
Dec. 9, 1998 (DE) .......................... 198 56 708

(51) Int. Cl.⁷ .......................... G01C 17/00; G06M 3/00
(52) U.S. Cl. .................. 702/150; 702/151; 702/154; 377/3
(58) Field of Search ................. 702/150, 151, 702/154, 158, 81, 94–95; 377/3, 15–17, 28; 33/574, 578, 579

(56) References Cited

U.S. PATENT DOCUMENTS

| | | | |
|---|---|---|---|
| 4,225,931 A | | 9/1980 | Schwefel |
| 4,229,646 A | | 10/1980 | Burkhardt et al. |
| 4,229,647 A | * | 10/1980 | Burkhardt .................. 377/3 |
| 4,276,696 A | | 7/1981 | Ernst |
| 4,306,220 A | | 12/1981 | Schwefel et al. |
| 4,477,189 A | | 10/1984 | Ernst |
| 4,519,140 A | * | 5/1985 | Schmitt .................... 33/706 |

(List continued on next page.)

FOREIGN PATENT DOCUMENTS

| | | |
|---|---|---|
| DE | 39 08 854 | 9/1989 |
| DE | 40 21 010 | 3/1991 |
| DE | 297 700 | 1/1992 |
| DE | 297 701 | 1/1992 |
| DE | 297 702 | 1/1992 |
| DE | 40 37 545 | 5/1992 |
| DE | 41 36 888 | 5/1993 |
| DE | 42 43 778 | 6/1994 |
| DE | 43 44 290 | 6/1994 |
| DE | 43 44 291 | 6/1994 |
| DE | 42 44 178 | 7/1994 |
| DE | 43 08 462 | 9/1994 |
| DE | 195 02 399 | 10/1995 |
| DE | 195 13 692 | 7/1996 |
| DE | 195 15 940 | 11/1996 |
| DE | 195 30 904 | 2/1997 |
| DE | 195 32 903 | 3/1997 |
| DE | 196 01 676 | 7/1997 |
| DE | 196 04 968 | 8/1997 |
| EP | 0 575 663 | 12/1993 |
| WO | WO 98/01724 | 1/1998 |

*Primary Examiner*—Marc S. Hoff
*Assistant Examiner*—Bryan Bui
(74) *Attorney, Agent, or Firm*—Brinks Hofer Gilson & Lione

(57) ABSTRACT

A method for operating a position measuring system and a suitable position measuring system in which after the onset of measurement incremental signals relating to the relative position of two parts movable relative to one another are generated by the position measuring system and transmitted to an evaluation unit in serial form at predetermined sampling times. Beyond a known, defined absolute position of the two parts movable relative to one another, absolute position signals are transmitted in serial form to the evaluation unit at the predetermined sampling times. It is also possible to ascertain a differential position value from the position data, which indicates the difference, occurring in the preceding sampling interval, between the most recently determined relative position value and the first absolute position value.

19 Claims, 5 Drawing Sheets

U.S. PATENT DOCUMENTS

| | | |
|---|---|---|
| 4,530,155 A | 7/1985 | Burkhardt et al. |
| 4,573,000 A * | 2/1986 | Nelle .................. 250/237 G |
| 4,594,538 A | 6/1986 | Schmitt |
| 4,594,579 A | 6/1986 | Schmitt et al. |
| 4,616,131 A | 10/1986 | Burkhardt |
| 4,700,062 A | 10/1987 | Ernst |
| 4,701,615 A | 10/1987 | Schmitt |
| 4,793,067 A | 12/1988 | Reimar et al. |
| 4,996,657 A | 2/1991 | Shiraishi et al. |
| 4,999,623 A | 3/1991 | Affa |
| 5,113,066 A | 5/1992 | Michel et al. |
| 5,120,132 A | 6/1992 | Spies et al. |
| 5,131,017 A * | 7/1992 | Huber et al. ................ 377/3 |
| 5,461,311 A | 10/1995 | Nakazato et al. |
| 5,493,290 A | 2/1996 | Kern |
| 5,497,083 A | 3/1996 | Nakazato et al. |
| 5,572,018 A | 11/1996 | Taniguchi et al. |
| 5,677,686 A | 10/1997 | Kachi et al. |
| 5,686,804 A | 11/1997 | Siraky |
| 5,687,103 A * | 11/1997 | Hagl et al. ................ 702/150 |
| 5,783,817 A | 7/1998 | Gohring |
| 6,124,588 A | 9/2000 | Hagl et al. |

* cited by examiner

METHOD FOR OPERATING A POSITION MEASURING SYSTEM AND POSITION MEASURING SYSTEM FOR THE PURPOSE

FIELD OF THE INVENTION

The present invention relates to a method for operating a position measuring system and to a suitable position measuring system for that purpose.

BACKGROUND OF THE INVENTION

Position measuring systems for determining the relative and absolute positions of two parts that are movable relative to one another are known. These systems include a scale having an incremental graduation as well as one or more reference marks for determining the absolute positional relationship between the two parts. Until the first or second time a reference mark is scanned, incremental scanning signals are generated by a scanning unit of the position measuring system as it scans the incremental graduation of the scale and are delivered to a counter unit. From the counter unit, incremental position data are transmitted in serial form to an evaluation unit located downstream. Thus, at defined sampling times, the current counter value of the counter unit is determined by the position measuring system, and the incremental position data are transmitted in the form of a code word to the evaluation unit. As soon as the reference marks on the scale are scanned by the scanning unit for the first or second time, the exact absolute position of the two parts is known. After that it is possible to transmit absolute position data or absolute position signals to the evaluation unit in the form of code words at the predetermined sampling times. The absolute relationship can be established by a single reference mark with a known position, or by a plurality of so-called spacing-encoded reference marks.

A problem with these systems arises, however, if the transmitted serial position data are then needed by the evaluation unit for the purpose of speed control. The problem arises with regard to determining the exact speed at the transition from incremental to absolute position measurement. In particular, the first time absolute position data are transmitted in the form of a code word that indicates the exact absolute position, a correct determination of the relative speed of the two parts in the preceding interval.

SUMMARY OF THE INVENTION

An object of the present invention is to disclose a method for operating a position measuring system and a suitable position measuring system with which position data can be transmitted in serial form to a downstream evaluation unit. In addition, it is an object of the present invention to assure that a correct determination of the relative speed of the two movable parts is possible.

Because a differential position value is formed according to the invention after the absolute relationship is established, it is assured that at this moment as well, an unequivocal determination of the relative speed of the two movable parts is possible. This assures precise speed control by the evaluation unit.

Regarding the formation of the differential position value, there are various possibilities, for example, the differential position value may already be formed by the position measuring system and transmitted together with the absolute position data transmitted for the first time.

Alternatively, it is also possible to transmit both the incremental position data and the absolute position data to the evaluation unit after the absolute relationship is established and for the formation of the differential position value to take place first in the evaluation unit.

It is understood that the present invention can be used in conjunction with various position measuring systems. For example, various physical scanning principles can be employed, such as optical, magnetic, inductive, or capacitive. Both rotary position measuring systems and linear position measuring systems can also be designed in accordance with the present invention.

Further advantages and details of the present invention will become apparent from the following detailed description of preferred embodiments in conjunction with the accompanying drawings.

DESCRIPTION OF THE PREFERRED EMBODIMENTS

Figure 1:
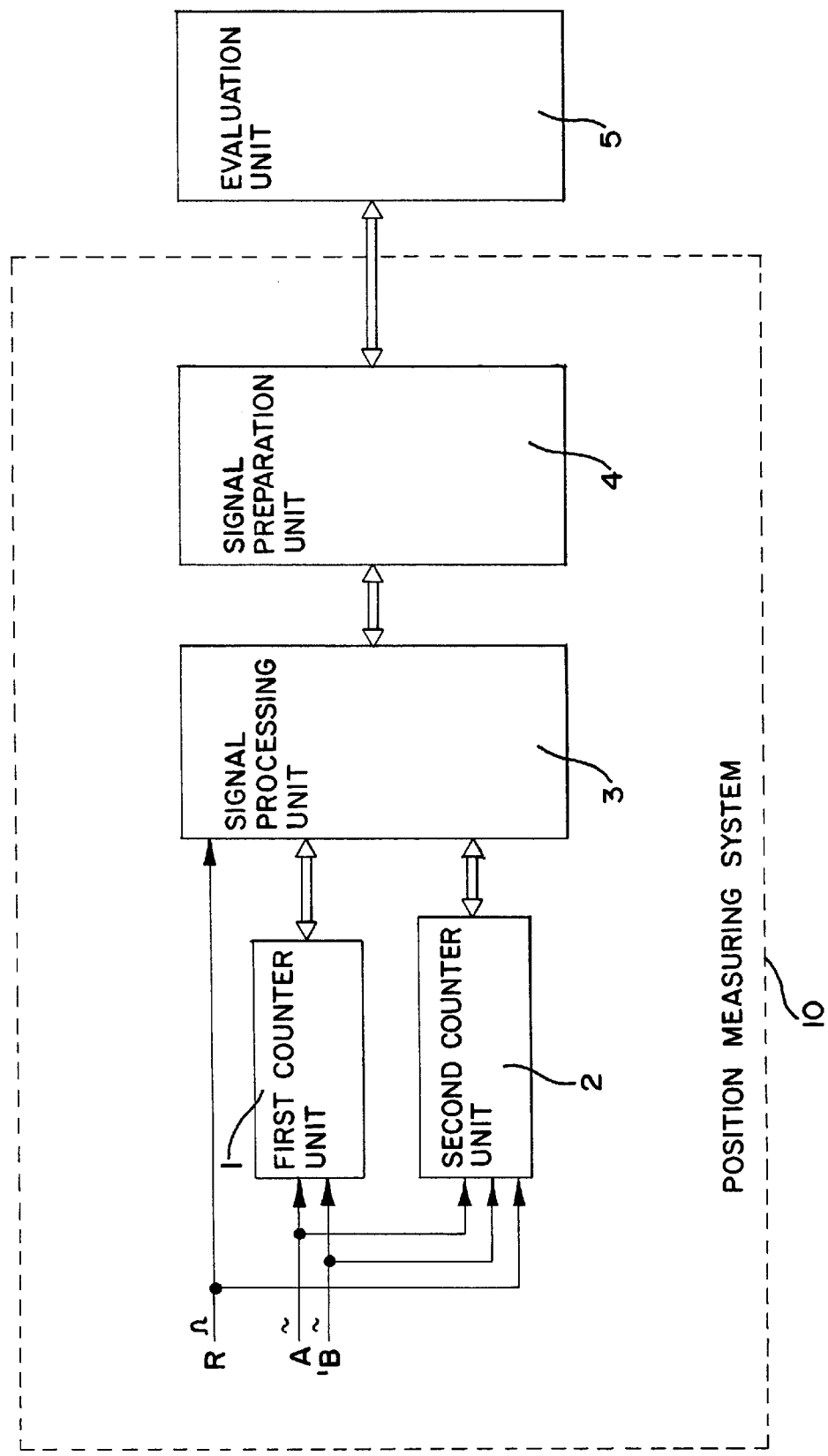
FIG. 1 is a schematic block diagram of a position measuring system according to a first preferred embodiment of the present invention in combination with an evaluation unit.

FIG. 1 is a schematic block diagram of a position measuring system according to a first preferred embodiment of the present invention in combination with an evaluation unit 5.

In the position measuring system 10, incremental signals A, B that are phase-offset by 90° with respect to one another are generated in a known manner which need not be described herein. This can be done by optically scanning an incremental graduation with the aid of a scanning unit where the incremental graduation is disposed on a scale that is movable relative to the scanner unit. A reference signal R is also generated at one or more defined relative positions of the scale and the scanner unit in order to establish an absolute relationship of the relative and incremental measurement. To that end, a reference mark line with one or more reference marks can be mounted at defined absolute positions on the scale laterally adjacent to an incremental graduation line, for example.

The incremental signals A, B are delivered to the first and second counter unit 1, 2, where in each case in a known manner the incremental signals A, B are accumulated. The respective counter states of the two counter units 1, 2 are sent downstream to the signal processing unit 3. In the signal processing unit 3, the processing of the various signals is done, in a manner to be described in further detail below, using the method of the present invention.

The reference signal R is delivered to both the second counter unit 2 and the signal processing unit 3. With regard to the processing according to the invention of the reference signal R and the two incremental signals A, B, reference is made to the description below of preferred embodiments of the method of the invention made in conjunction with FIGS. 2–5.

A signal preparation unit 4, located downstream of the signal processing unit 3, allows the position-related data to be finally transmitted to the evaluation unit 5. The position-related data are prepared in such a way that a transmission of various data in serial form, such as in the form of suitable code words, is possible.

The position measuring system 10 can be used with a numerically controlled machine tool, for example, in which case the downstream evaluation unit 5 would correspond to the machine tool control.

The position measuring system 10 includes a first and a second counter unit 1, 2 respectively. Located downstream of the first and second counter units 1, 2 is a signal processing unit 3 and a signal preparation unit 4.

It will also be noted that the block diagram shown in FIG. 1 is to be understood solely as a schematic. Thus, the present invention can be used with both linear and rotary position measuring systems. In addition, it is understood that the provisions of the invention can also be used in conjunction with other physical scanning principles, such as magnetic, capacitive or inductive position measuring systems. It is also understood that various further possibilities exist with regard to generating the reference signals and disposing the signal-processing components in the position measuring system, within the context of the present invention.

Figure 2:
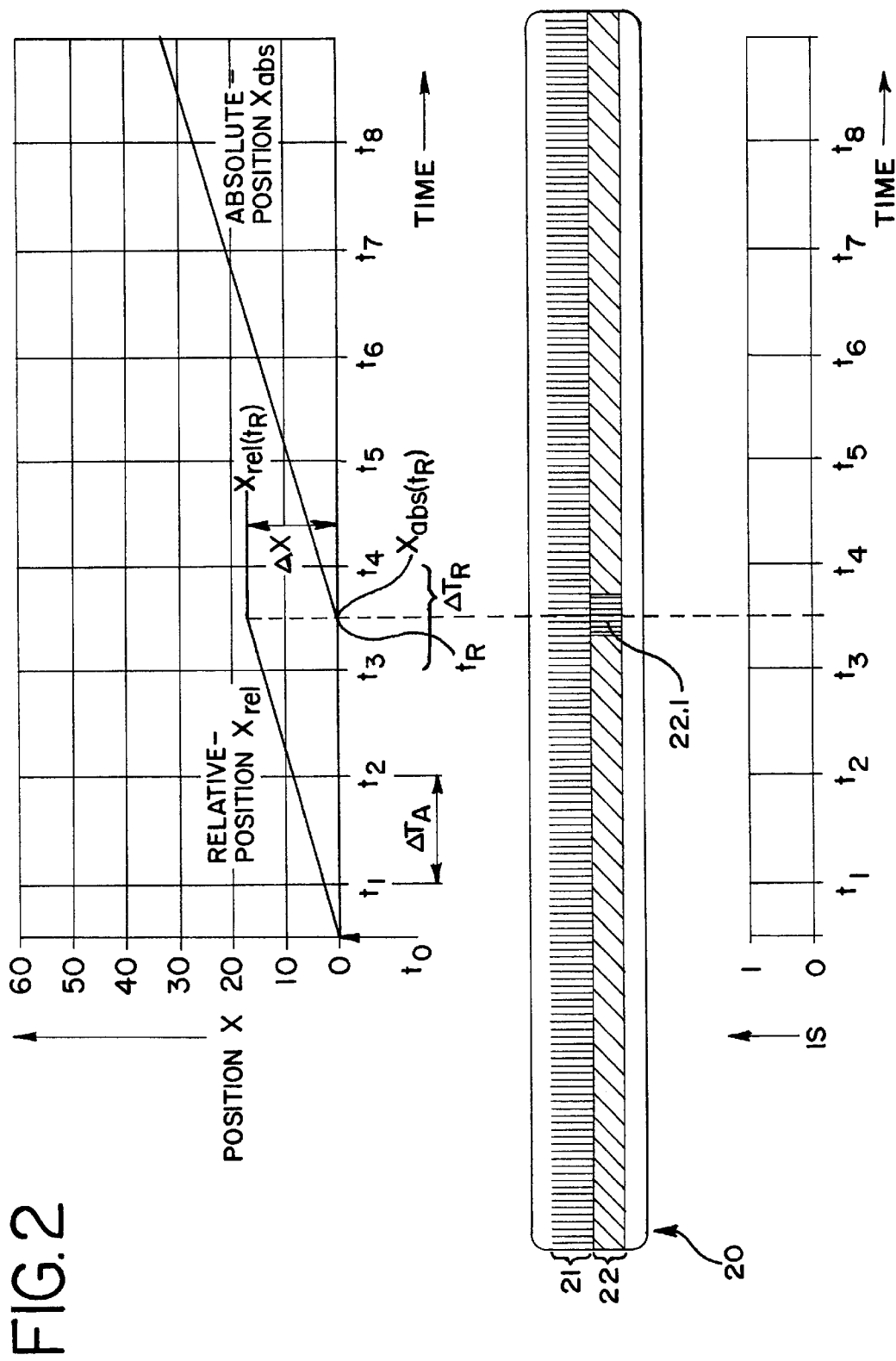
FIG. 2 illustrates a scale, a graph of position versus time and a graph of an identification signal (IS) versus time according to a first preferred embodiment of the present invention.

In conjunction with FIG. 2, the method of the invention according to a first preferred embodiment including the associated apparatus will be described below. Shown in FIG. 2 is a scale 20 which is scanned by a scanning unit (not shown) and a graph of position versus time and a graph pertaining to a transmitted identification signal IS.

In this preferred embodiment, the scale 20 includes an incremental graduation line 21 and a reference mark line 22 laterally adjacent to the incremental graduation line 21. In this preferred embodiment there is only a single reference mark 22.1. By this reference mark 22.1, a defined absolute position can be determined between the scale 20 and the scanning unit. The position and time graph of FIG. 2 shows how at the start of measurement, after the supply voltage has been turned on at time $t_0$, the relative position $x_{rel}$ of the two parts movable relative to one another is first determined by an incremental measurement. At this point the incremental signals A, B do not enable any defined knowledge of the exact absolute position of the scale 20 and scanning unit. During this time, incremental signals A, B are delivered to the first counter unit 1 (FIG. 1), whose counter state corresponds to the respective incremental position data $x_{rel}$. The counter state with the relative position data $X_{rel}$, or the incremental position data, is transmitted to the evaluation unit 5 after suitable processing and preparation, in serial form, as a code word $x_{rel}(t_n)$ or data word, at predetermined sampling times $t_n$ (where n=1, 2, 3, ... ). Although, in terms of evaluation, the exact position of the scale 20 and scanning unit is not yet possible during this phase, still with the aid of the transmitted incremental position data or the counter values with regard to the relative positions $x_{rel}(t_n)$, at least the speed of a drive mechanism that effects the relative motion of the scale and scanning unit can be ascertained. To that end, in the evaluation unit, the relative speed (v) of the parts movable relative to one another can be determined using equation 1 below:

$$v=(x_{rel}(t_n)-x_{rel}(t_{n-1}))/\Delta T_A \qquad \text{(Equation 1)}$$

where
  v=relative speed of the two parts;
  $x_{rel}(t_n)$=transmitted incremental position data at the sampling time $t_n$;
  $x_{rel}(t_{n-1})$=transmitted incremental position data at the sampling time $t_{n-1}$; and
  $\Delta T_A$=length of the sampling interval In this preferred embodiment, the reference mark 22.1 on the scale 20 is scanned between the two sampling times $t_3$ and $t_4$, and more particularly at time $t_R$ in this example. A corresponding reference signal R is generated and detected in a known manner. From this time $t_R$ on, the absolute position $x_{abs}$ of the two parts is known exactly. In the following measurement phase, the incremental measurement signals generated can be referred to the now-known absolute position $x_{abs}$.

As soon as the reference signal R is detected at time $t_R$, the second counter unit 2 is set to the position value $x_{abs}(t_R)=0$, and then measurement continues incrementally beginning at the set counter value $x_{abs}(t_R)=0$. The reference signal R is delivered to both the second counter unit 2 and the signal processing unit 3.

It is also to be understood that the counter value $x_{abs}$ of the second counter unit can be set at time $t_R$ to some other defined absolute position value $x_{abs}(t_R)$ other than zero.

At the sampling time $t_4$, for the first time correct absolute position data can be transmitted in the form of the counter value $x_{abs}(t_4)$ to the evaluation unit. These absolute position data in turn correspond to a known counter state of the second counter unit 2, which is transmitted, prepared in suitable form as a data word in the dual code or as a code word, to the evaluation unit 5.

In the first measurement phase, until the reference mark 22.1 is scanned, an identification signal IS is transmitted to the evaluation unit 5, along with the serially transmitted incremental position data $x_{rel}(t_n)$. The evaluation unit knows that an exact absolute relationship has not yet been established in the measurement based on the value of the identification signal, and at the present time the relative position data are being transmitted without an absolute relationship. In the preferred embodiment shown, the identification signal IS comprises one bit, which is serially transmitted in conjunction with the code word and is set, in this measurement phase, to "0". After the absolute relationship has been made by scanning the reference mark 22.1, this bit of the individual signal IS is then set to "1" and again transmitted serially to the evaluation unit in conjunction with the code word with respect to the then-known absolute position $x_{abs}$ at the sampling times $t_n$ (where n>3). In this way, it is assured that the current type of position measurement is always known by the evaluation unit.

In order to assure that a correct speed or rpm governing on the basis of the data transmitted to the evaluation unit is possible at every sampling time $t_n$, the differential position value $\Delta x$ between the last relative position value $x_{rel}(t_R)$ and the first known absolute position value $x_{abs}(t_R)$ is determined in the position measuring system by the signal processing unit 3. The ascertained differential position value $\Delta x = x_{rel}(t_R) - x_{abs}(t_R)$ is transmitted to the evaluation unit at the next sampling time $t_4$, along with the code word with respect to the absolute position and the identification signal IS. In the evaluation unit 5, with the aid of the differential position value Δx, it is thus also possible to determine the relative speed of the two parts movable relative to one another correctly in the preceding sampling interval $\Delta t_R$ between the sampling times $t_3$ and $t_4$. This can be determined by using the below equation:

$$v = (x_{abs}(t_4) - x_{rel}(t_3) - \Delta x / \Delta T_A) \quad \text{(Equation 2)}$$

in which, as above:

v=relative speed of the two parts;

$x_{abs}(t_n)$=transmitted incremental position data at the sampling time $t_3$;

$(x_{abs}(t_4)$=transmitted incremental position data at the sampling time $t_4$; and $\Delta T_A$:=length of the sampling interval.

In the sampling interval $\Delta T_R$ before the first time the absolute position signal is transmitted, the correct speed v of the two parts movable relative to one another can thus also be determined in the evaluation unit. This assures high-precision speed control at every moment, especially when the absolute relationship is established.

The processing of the various counter states, establishment of the absolute relationship, calculation of the differential position value, switchover of the identification signal, etc., described above are done here with the aid of the signal processing unit of the position measuring system. This can be embodied by hardware or software as suitable.

Figure 3:
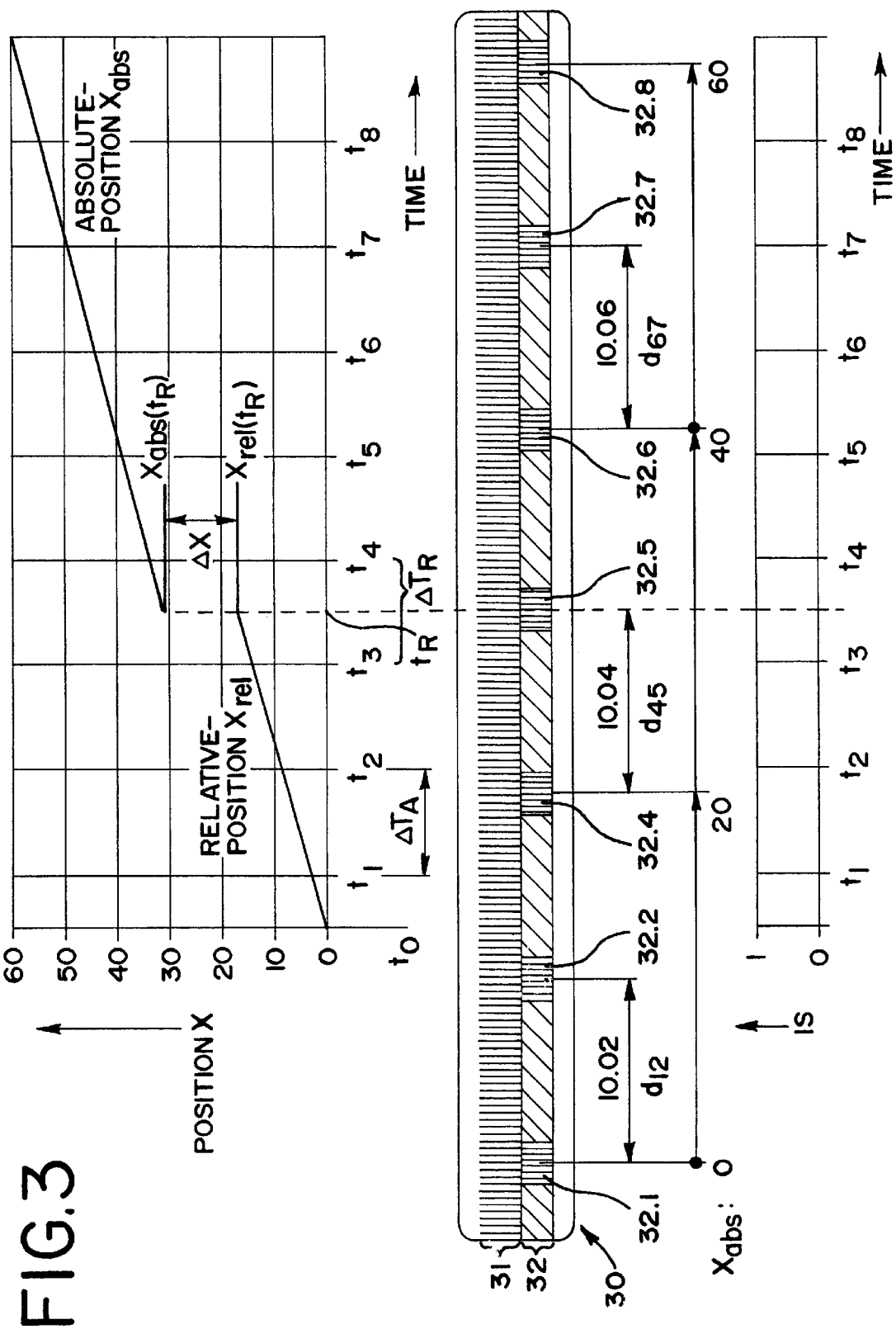
FIG. 3 illustrates a scale, a graph of position versus time and a graph of an identification signal (IS) versus time according to a second preferred embodiment of the present invention.

A second preferred embodiment of the method and position measuring system according to the invention will be described below in conjunction with FIG. 3. Once again, a position versus time graph is shown, with a scale 30 and a graph relating to the identification signal IS transmitted. Also, an axis with absolute positions $x_{abs}$ in arbitrary units is shown below the scale 30. Unlike the embodiment above with reference to FIG. 2, the reference mark line 32 includes so-called spacing-encoded reference marks 32.1 through 32.8, for making the absolute relationship. In order to establish the desired absolute relationship in the position measurement, it is necessary that at least two reference marks 32.1 through 32.8 be scanned, whose spacing $d_{nm}$ to one another is determined by an incremental measurement.

In the example shown, after the current supply is turned on at time $t_0$, first, as in the embodiment described above, the relative position $x_{rel}$ of the two parts is determined by scanning the incremental graduation line 31. The incremental signals A, B are again delivered to the first counter unit which adds up the counter values in the form of the relative positions from $x_{rel}$=0, beginning in this measurement phase. The counter values $x_{rel}(t_n)$ of the first counter unit relating to the relative position of the scale 30 and the scanning unit are again transmitted in the form of incremental position data in serial form as a data word, encoded, to the evaluation unit at the sampling times $t_n$ (n=1,2,3, . . . ).

Between the sampling times $t_1$ and $t_2$, a reference mark 32.4 is scanned for the first time; the same is true for a second reference mark 32.5 between the sampling times $t_3$ and $t_4$; the spacing $d_{45}$=10.04 located between these reference marks is determined by the incremental measurement. From the known spacing $d_{45}$ between the two scanned reference marks 32.4 and 32.5, the exact absolute position $x_{abs}(t_R)$=30 of the scale 30 with respect to the scanning unit (not shown) is known at time $t_R$. Thus from the sampling time $t_4$ on, the exact absolute position $X_{abs}(t_4)$ between the two movable parts can thus be transmitted to the evaluation unit at the sampling times $t_n$ (where n≧4). When the second reference mark 32.5 is scanned, the second counter unit is set to the correct absolute position $x_{abs}$=30, and after that the counter state of the second counter unit is updated by the incremental measurement.

In order now to enable a correct speed determination in the evaluation unit and correspondingly speed control at any time, when the reference mark 32.5 is scanned at time $t_R$, the differential position value Δx between the last relative position value $x_{rel}(t_R)$ of the first counter unit and the first known absolute position value $x_{abs}(t_R)$ of the second counter unit is determined in the position measuring system. The differential position value $\Delta x = x_{rel}(t_R) - x_{abs}(t_R)$ ascertained is also transmitted to the evaluation unit at the next sampling time $t_4$, along with the code word relating to the absolute position $x_{abs}$ $t_4$ and an identification signal IS. With respect to the identification signal IS, reference is also made to the first preferred embodiment described above.

In the evaluation unit, with the aid of the differential position value Δx, it is thus also possible for the relative speed of the two parts to be determined correctly in the preceding sampling interval $\Delta T_R$ between the sampling times $t_3$, $t_4$, for example by Equation (2) described above. At the moment the absolute relationship is established as well, exact speed or rpm governing is thus also possible.

The various components in the position measuring system shown in the drawing perform fundamentally similar tasks in the second preferred embodiment to those in the first preferred embodiment described.

In the two preferred embodiments described thus far, it was provided in each case the differential position value Δx be determined in the position measuring system and transmitted to the downstream evaluation unit. To be described next are two further preferred embodiments of the invention in which the formation of the differential position value Δx is not done until the evaluation unit, on the basis of the transmitted data.

Figure 4:
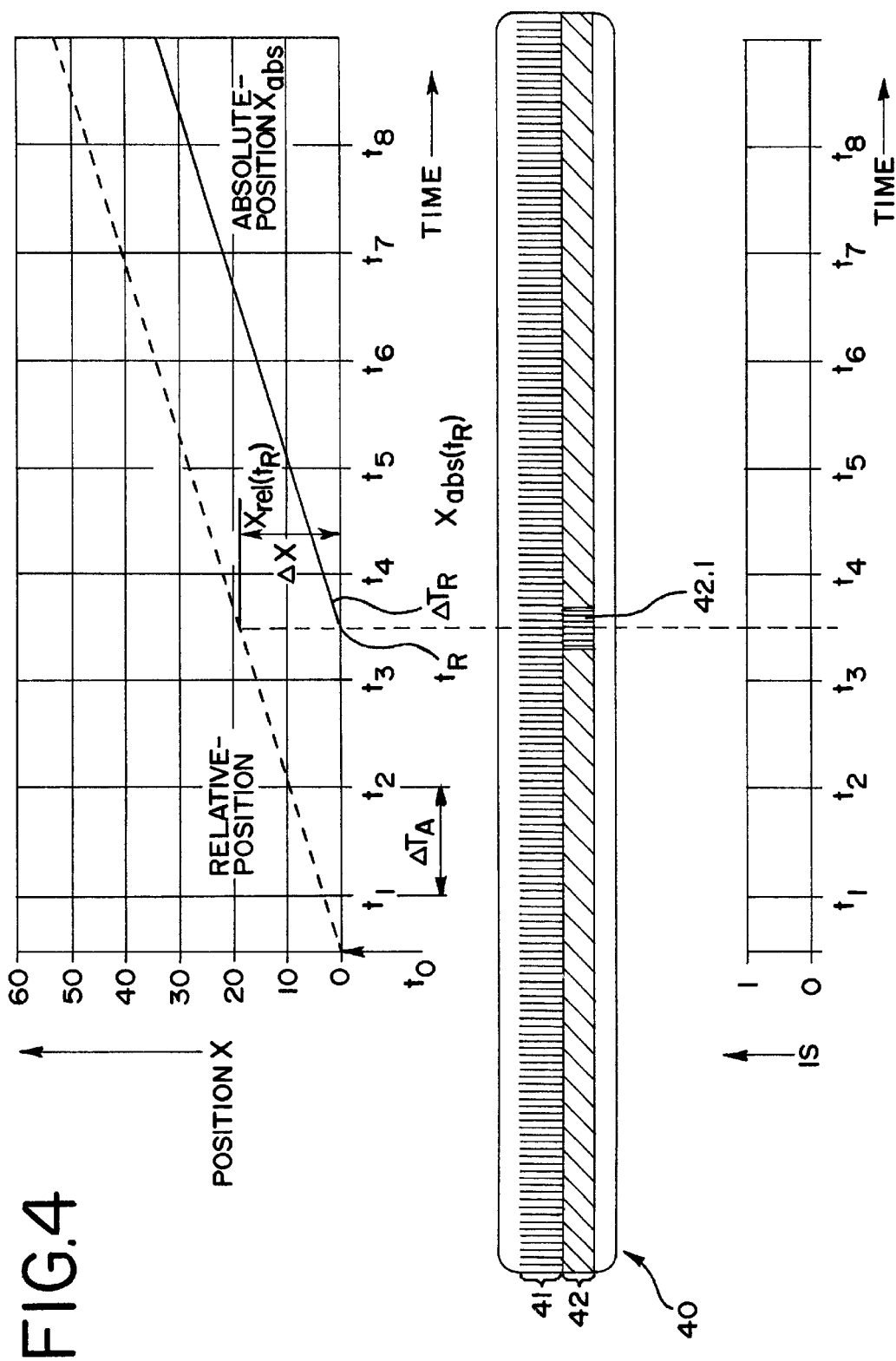
FIG. 4 illustrates a scale, a graph of position versus time and a graph of an identification signal (IS) versus time according to a third preferred embodiment of the present invention.

FIG. 4 shows a position versus time graph, a scale 40, and a graph relating to the transmitted identification signal IS. An axis with the absolute positions $x_{abs}$ in arbitrary units is also shown below the scale 40. Only the decisive differences in this embodiment compared with the example in FIG. 2 will be addressed below; otherwise, reference can be made to the description and reference numerals pertaining to FIG. 2.

Unlike the preferred embodiment of FIG. 2, it is now provided that incremental position data $x_{rel}(t_n)$ be transmitted along with, or in addition to, the absolute position data $x_{abs}(t_n)$ on reaching the reference mark 42.1. This is done by the serial transmission of the corresponding counter states of the two counter units within the framework of the transmission protocol intended. The formation of the differential position value Δx, which is required for precise speed control, is done on the basis of the transmitted position data or counter states in the evaluation unit. The differential position value Δx is formed in the evaluation unit in the same way as in the previous examples above.

Figure 5:
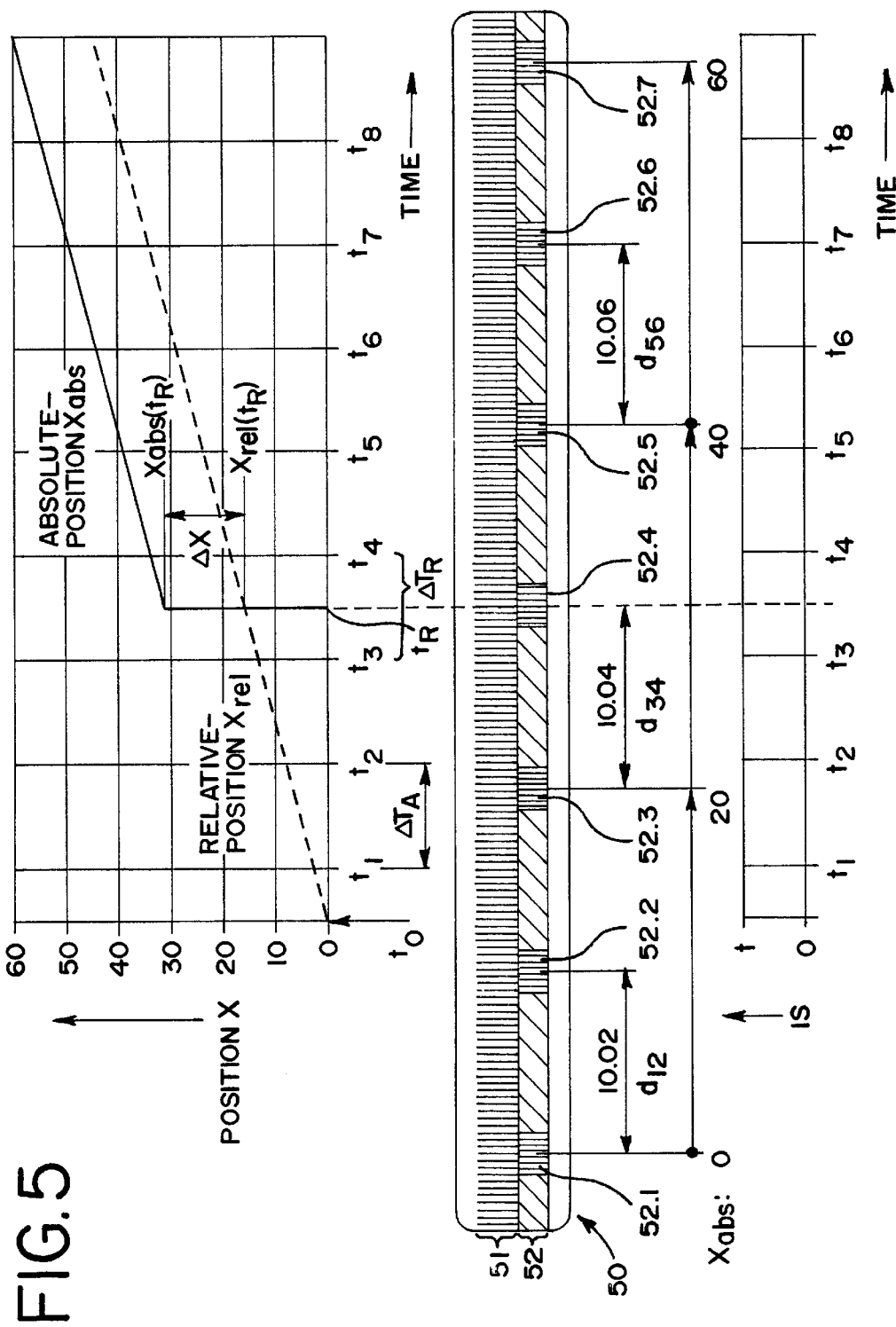
FIG. 5 illustrates a scale, a graph of position versus time and a graph of an identification signal (IS) versus time according to a fourth preferred embodiment of the present invention.

A similar procedure is contemplated in a fourth preferred embodiment as well, which will be briefly described in conjunction with FIG. 5. This embodiment is similar to the embodiment shown in FIG. 3, with spacing-encoded reference marks. Accordingly, only the differences from the embodiment already described will be addressed.

As in the embodiment of FIG. 4, it is contemplated that after the absolute relationship is established, that is, the scanning of the second reference mark 52.4 at time $t_R$, along with the absolute position data $x_{abs}(t_n)$ the incremental position data $x_{abs}(t_n)$ be transmitted to the evaluation unit. Once again, this is done by correspondingly transmitting the respective counter states of the two counter units in serial form at the sampling times $t_n$. As explained above, the differential position value Δx is accordingly not formed until the evaluation unit, on the basis of the transmitted data relating to the relative and absolute positions.

In addition to the preferred embodiments described, it is understood that various other possibilities for suitable modification of the methods of the invention also exist.

What is claimed is:

1. A method for operating a position measuring system, the method comprising the steps of:
   (a) generating incremental signals relating to the relative position of two parts movable relative to one another with the position measuring system;
   (b) calculating incremental position data ($x_{rel}(t_n)$) from the incremental signals;
   (c) transmitting the incremental position data ($x_{rel(tn)}$) to an evaluation unit;
   (d) after a defined, absolute position of the two parts movable relative to one another is determined, calculating absolute position data ($x_{abs}(t_n)$) and transmitting the absolute position data to the evaluation unit; and
   (e) after the absolute position is determined, calculating a differential position value ($\Delta x$), which indicates the difference between the most recently determined incremental position data ($x_{rel}(t_n)$) and the absolute position data ($x_{abs}(t_n)$) determined for the first time.

2. A method according to claim 1 wherein the step (c) further comprises the step of transmitting incremental position data ($x_{rel}(t_n)$) in serial form at predetermined sampling times ($t_n$).

3. A method according to claim 1 wherein the step (d) further comprises the step of transmitting absolute position data ($x_{abs}(t_n)$) in serial form at predetermined sampling times ($t_n$).

4. The method of claim 1, wherein step (e) is performed by the position measuring system, and further comprising the step of transmitting the differential position value ($\Delta x$) to the evaluation unit.

5. The method of claim 4, wherein step (b) is performed by a first counter unit located in the position measuring system and the step (d) of calculating the absolute position data ($x_{abs}(t_n)$) is performed by a second counter unit located in the position measuring system, the method further comprising the step of transmitting the difference between the two counter unit states when the first time the absolute position data ($x_{abs}(t_n)$) is transmitted as a differential position value ($\Delta x$) to the evaluation unit.

6. The method of claim 1, wherein the calculating step (b) and transmitting step (c) of the incremental position data ($x_{rel}(t_n)$) to the evaluation unit only occurs before the absolute position of the parts is determined in step (d).

7. The method of claim 1 wherein step (d) of determining the absolute position of the two parts includes the step of scanning a reference mark or a scale for the first time.

8. The method of claim 1, further comprising the step of transmitting one unequivocal identification signal (IS) to identify whether an incremental position data ($x_{rel}(t_n)$) or an absolute position data ($x_{abs}(t_n)$) has been transmitted to the evaluation unit.

9. The method of claim 8, wherein the transmitted identification signal (IS) can assume two possible logical states, which are unequivocally associated with the transmission of either the incremental position data ($x_{rel}(t_n)$) or the absolute position data ($x_{abs}(t_n)$).

10. The method of claim 1, wherein after the absolute position is determined, both incremental position data ($x_{rel}(t_n)$) and absolute position data ($x_{abs}(t_n)$) are transmitted by the position measuring system to the evaluation unit.

11. The method of claim 10 wherein step (e) is performed by the evaluation unit using the transmitted incremental position data ($x_{rel}(t_n)$) and the transmitted absolute data ($x_{abs}(t_n)$).

12. The method of claim 1, further comprising the step of calculating relative speed between the parts movable relative to one another in an sampling interval that precedes the transmission for the first time of absolute position data ($x_{abs}(t_n)$).

13. A position measuring system for determining the relative position of two parts movable relative to one another, the system comprising:
   a first counter unit which receives signals generated by a scanning unit scanning an incremental graduation located on a scale and calculates incremental position data ($x_{rel}(t_n)$) at its output; and
   a second counter unit which receives signals generated by the scanning unit scanning the incremental graduation located on the scale and scanning a reference mark located on the scale and calculates absolute position data ($x_{abs}(t_n)$) from these received signals and outputs the absolute position data ($x_{abs}(t_n)$) at its output, wherein the first and second counter units are coupled to a signal processing unit located downstream wherein the signal processing unit assures that the first time absolute position data ($x_{abs}(t_n)$) are transmitted, a differential position value ($\Delta x$) that indicates the difference between the most recently determined incremental position data and the absolute position data determined for the first time can be transmitted to an evaluation unit located downstream of the position measuring system.

14. The position measuring system of claim 13, wherein the reference mark is disposed at a defined absolute position on the scale of the position measuring system.

15. The position measuring system of claim 13, wherein at least two reference marks are disposed on the scale of the position measuring system, with an unequivocally defined spacing from one another.

16. The position measuring system of claim 13, wherein an associated identification signal (IS) is transmitted with the incremental position data ($x_{rel}(t_n)$) and the absolute position data ($x_{abs}(t_n)$) to an evaluation unit located downstream of the position measuring system as well as an evaluation unit.

17. A position measuring system for determining the relative position of two parts movable relative to one another, the system comprising:
   a first counter unit which receives signals generated by a scanning unit scanning an incremental graduation located on a scale and calculates incremental position data ($x_{abs}(t_n)$) at its output; and
   a second counter unit which receives signals generated by the scanning unit scanning the incremental graduation located on the scale and scanning a reference mark located on the scale and calculates absolute position data ($x_{abs}(t_n)$) from these received signals and outputs the absolute position data ($x_{abs}(t_n)$) at its output, wherein an associated identification signal (IS) is transmitted with the incremental position data ($x_{rel}(t_n)$) and the absolute position data ($x_{abs}(t_n)$) to an evaluation unit located downstream of the position measuring system as well as an evaluation unit.

18. The position measuring system of claim 17, wherein the reference mark is disposed at a defined absolute position on the scale of the position measuring system.

19. The position measuring system of claim 17, wherein at least two reference marks are disposed on the scale of the position measuring system, with an unequivocally defined spacing from one another.

* * * * *

UNITED STATES PATENT AND TRADEMARK OFFICE
CERTIFICATE OF CORRECTION

PATENT NO. : 6,418,396 B2
DATED : July 9, 2002
INVENTOR(S) : Rainer Hagl

It is certified that error appears in the above-identified patent and that said Letters Patent is hereby corrected as shown below:

Column 7,
Line 9, delete "$(X_{rel(tn)})$" and substitute -- $(X_{rel}(t_n))$ -- in its place.

Column 8,
Line 3, delete "in an" and substitute -- in a -- in its place.
Lines 15 and 37, delete "$(X_{abs}(t_n)$" and substitute -- $(X_{abs}(t_n))$ -- in its place.
Line 46, delete "$(X_{abs}(t_n))$" and substitute -- $(X_{rel}(t_n))$ -- in its place.
Line 55, delete "$(X_{abs}(t_n)$" and substitute -- $(X_{abs}(t_n))$ -- in its place.

Signed and Sealed this

First Day of April, 2003

JAMES E. ROGAN
*Director of the United States Patent and Trademark Office*